United States Patent
He et al.

(10) Patent No.: US 8,848,379 B2
(45) Date of Patent: Sep. 30, 2014

(54) MOUNTING APPARATUS FOR MEMORY CARD

(75) Inventors: Ai-Ling He, Shenzhen (CN); Jun-Hui Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 247 days.

(21) Appl. No.: 13/465,043

(22) Filed: May 7, 2012

(65) Prior Publication Data

US 2013/0250537 A1    Sep. 26, 2013

(30) Foreign Application Priority Data

Mar. 20, 2012   (CN) .......................... 2012 1 0074256

(51) Int. Cl.
    *H05K 7/14*    (2006.01)

(52) U.S. Cl.
    USPC ............................ 361/737; 361/801; 361/755

(58) Field of Classification Search
    USPC ............ 361/679.01, 728, 737, 736, 747, 755, 361/801, 802; 439/55, 325–328, 296, 152, 439/153, 157, 540.1, 540.3, 625–626, 629
    See application file for complete search history.

(56) References Cited

U.S. PATENT DOCUMENTS

| | | | |
|---|---|---|---|
| 6,045,385 A * | 4/2000 | Kane | 439/327 |
| 6,824,413 B1 * | 11/2004 | Shipe et al. | 439/326 |
| 7,203,076 B1 * | 4/2007 | Liang | 361/801 |
| 7,661,974 B1 * | 2/2010 | Sun | 439/328 |
| 7,990,733 B2 * | 8/2011 | Hsieh et al. | 361/759 |
| 8,075,330 B1 * | 12/2011 | Deng et al. | 439/328 |
| 8,087,950 B1 * | 1/2012 | Deng et al. | 439/328 |

\* cited by examiner

*Primary Examiner* — Hung S Bui

(74) *Attorney, Agent, or Firm* — Novak Druce Connolly Bove + Quigg LLP

(57) ABSTRACT

A latching apparatus for a memory card includes a socket and a pair of latching members assembled on opposite ends of the socket. A cutout is defined in each end of the memory card. Each latching member includes a main body, two pivoting portions extending from opposite ends of the main body for pivotably attaching the latch member to one end of the socket, and a C-shaped locking portion extending down from a middle portion of the main body. The insertion of the memory card in the socket causes the bottom edge of the memory card to engage with distal ends of the locking portions and so rotate the latch member, until the main bodies of the latching members engage in the cutouts of the memory card.

15 Claims, 7 Drawing Sheets

MOUNTING APPARATUS FOR MEMORY CARD

BACKGROUND

1. Technical Field

The present disclosure relates to mounting apparatuses and, more particularly, to a mounting apparatus for a memory card.

2. Description of Related Art

Referring to FIG. 7, a conventional mounting for mounting a memory card is shown in a socket 100 of a motherboard. Two latch members 200 are attached to two opposite ends of the socket 100. Each latch member 200 includes a latch portion 201 for latching the memory card, and a handle 202 integrally extending outward from the latch portion 201 for operating the latch portion 201. The handle 202 can interfere with other elements on the motherboard when the other elements are arranged near the memory card, which means full use cannot be made of space around the socket 100.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

Figure 3:
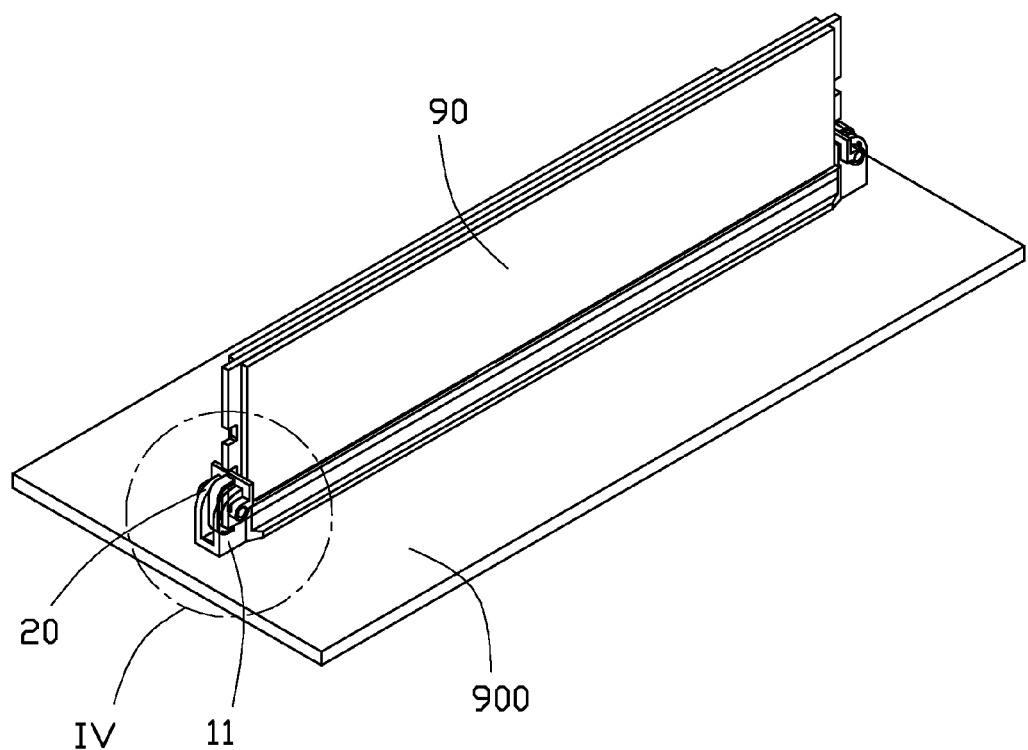
FIG. 3 is an assembled, isometric view of the latching member of FIG. 1.
Figure 5:
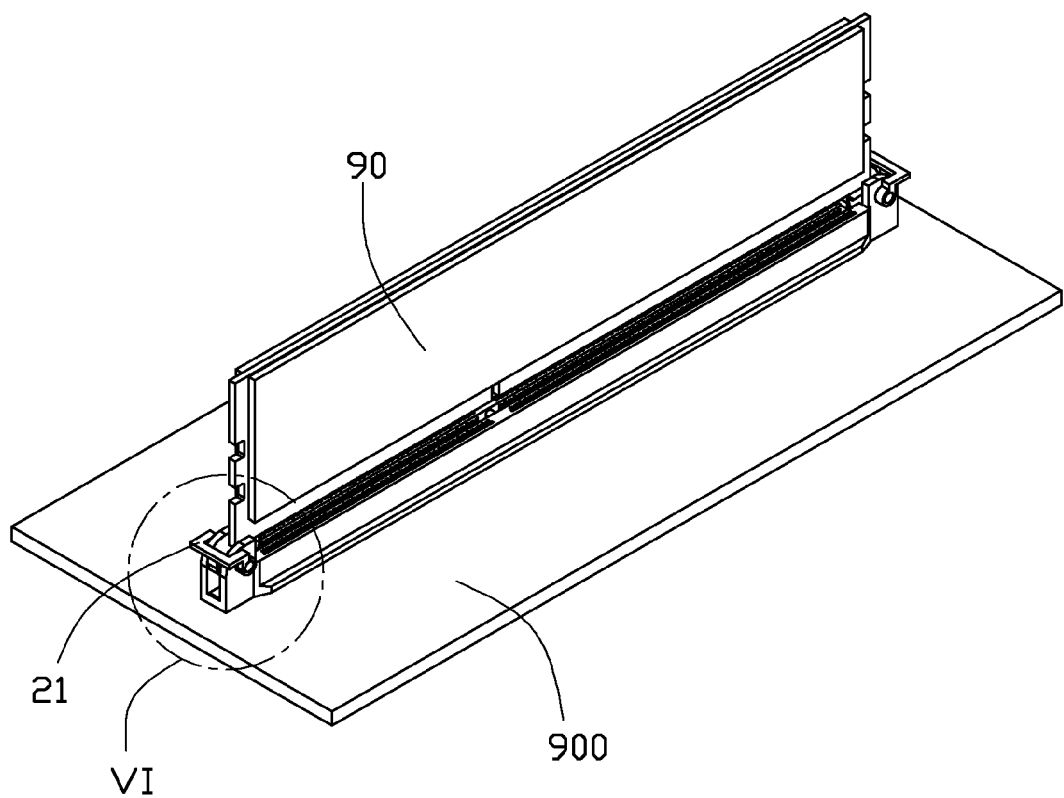

The latching member of FIG. 5 is similar to that of FIG. 3, but showing a different state of use.

Figure 6:
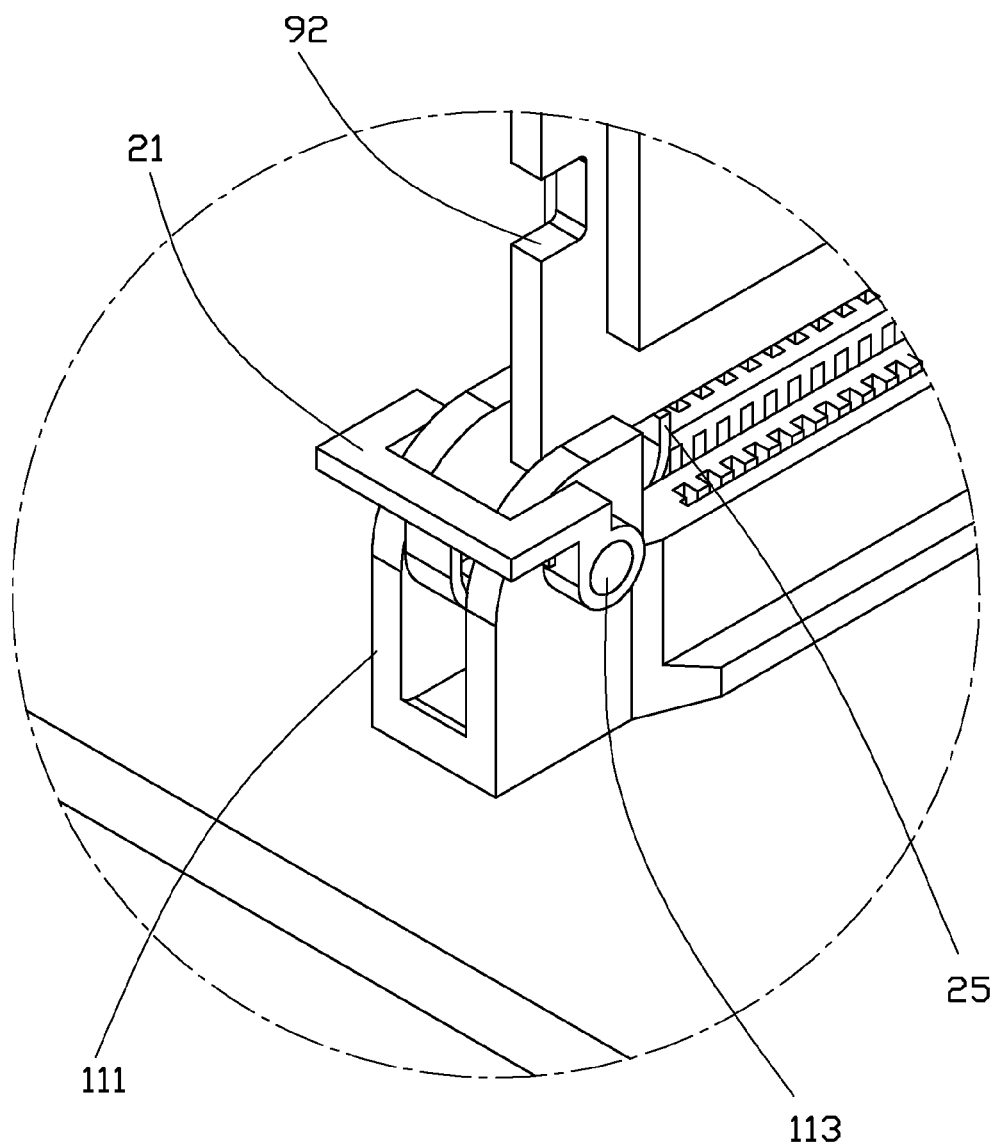

FIG. 6 is an enlarged view of the circled portion VI of FIG. 5.

Figure 7:
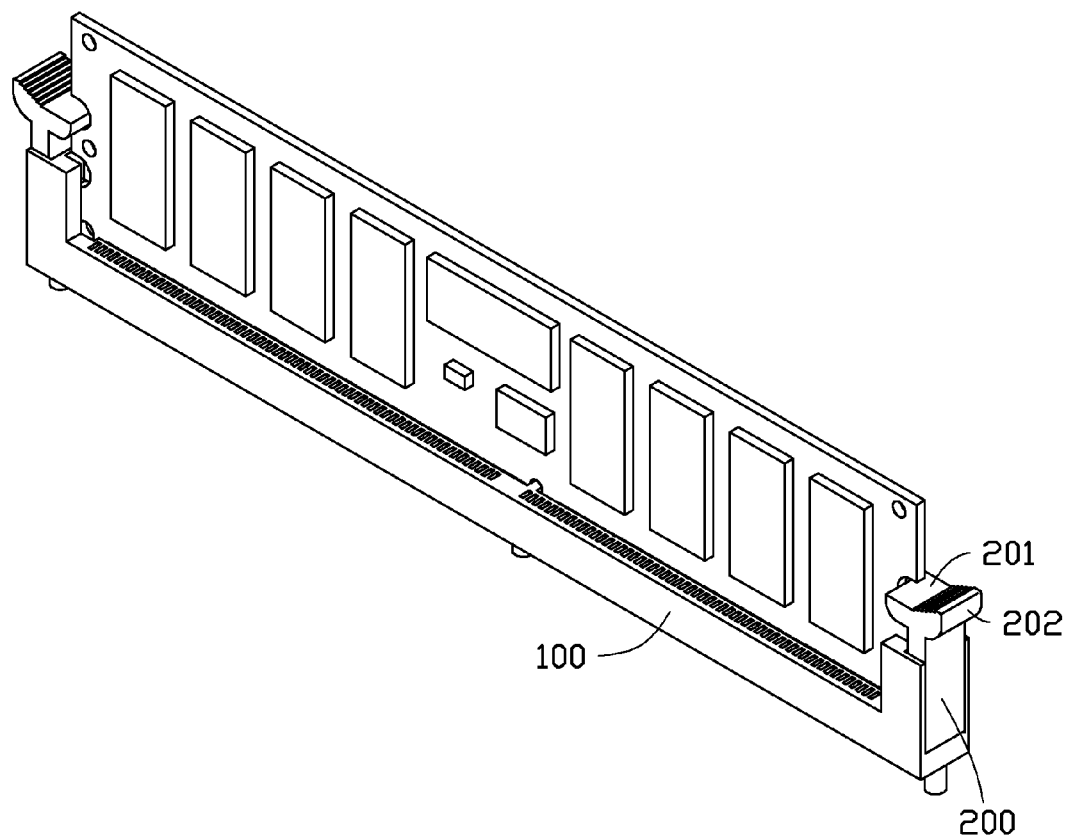

FIG. 7 is an assembled, isometric view of a related-art mounting apparatus, together with a memory card.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

Figure 1:
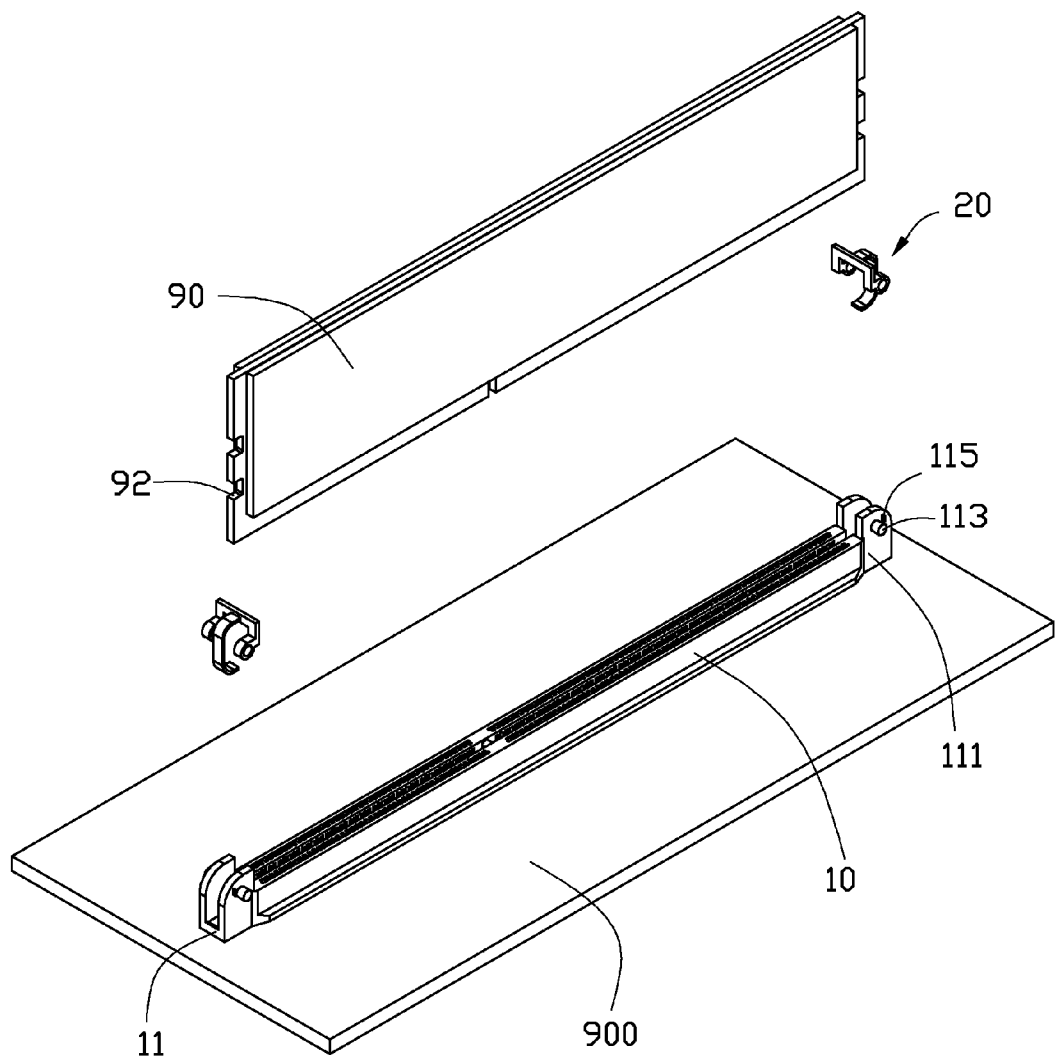
FIG. 1 is an exploded, isometric view of an embodiment of a mounting apparatus, together with a memory card, the mounting apparatus includes a latching member.
Figure 2:
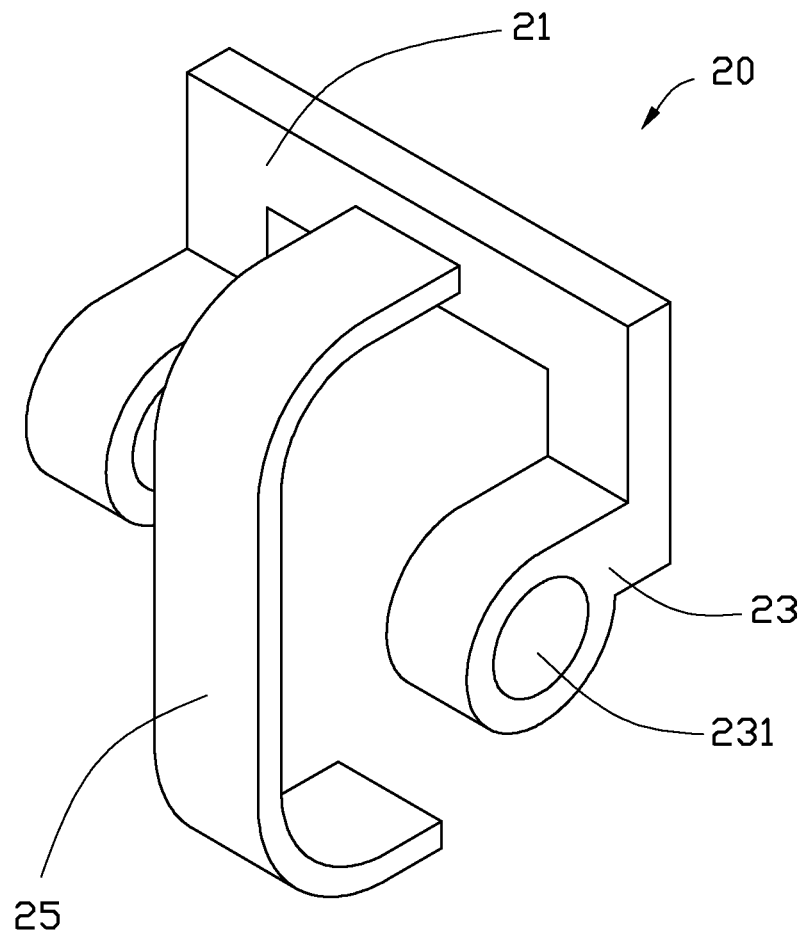
FIG. 2 is an enlarged view of the latching member of FIG. 1.

Referring to FIG. 1 to FIG. 3, an embodiment of a mounting apparatus is provided, for mounting a memory card 90. The mounting apparatus includes a socket 10 mounted on a motherboard 900 and two latching members 20. A cutout 92 is defined in each end of the memory card 90.

A connecting portion 11 is formed on each end of the socket 10. Each connecting portion 11 includes two parallel supporting plates 111 perpendicular to the motherboard 900. A pin 113 and a positioning block 115 protrude from an outer surface of each supporting plate 111.

Referring to FIG. 2, the latching member 20 at each end of the socket 10 includes a substantially n-shaped main body 21, a pivoting portion 23 extending from each end of the main body 21, and a C-shaped hooking portion 25 extending down from a middle portion of the main body 21. Each pivoting portion 23 defines a pivot hole 231.

Figure 4:
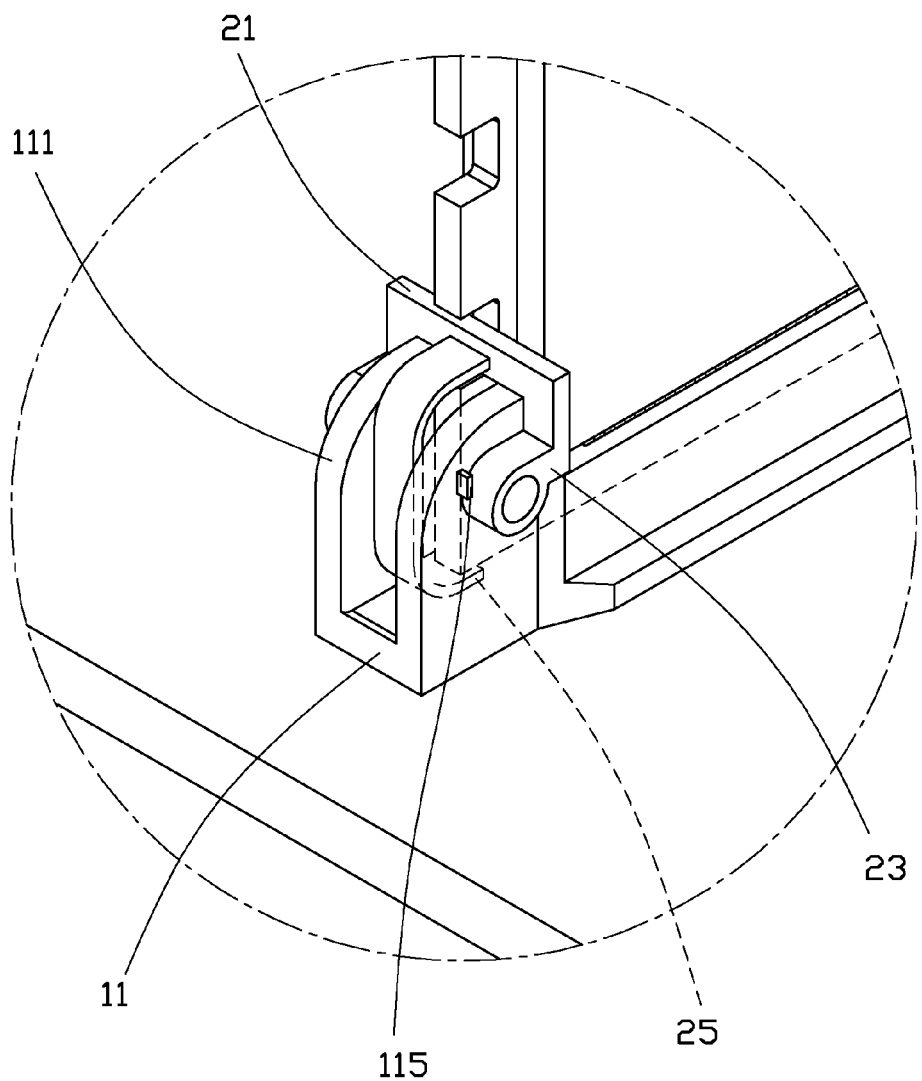
FIG. 4 is an enlarged view of the circled portion IV of FIG. 3.

Referring to FIGS. 3 and 4, in assembly, the pins 113 are engaged in the pivot holes 231, to pivotably attach the latching members 20 to the connecting portions 11. The hooking portion 25 is located between the supporting plates 111.

When the memory card 90 is pressed into the socket 10, a bottom of the memory card 90 causes the hooking portions 25 to rotate, to make both of the main bodies 21 engage in the cutouts 92.

When the memory card 90 is to be released, the main bodies 21 are pivoted outward until the main bodies 21 are released from the cutouts 92. The locking portions 25 rotate to push up the memory card 90. The main bodies 21 are blocked from further movement by the positioning blocks 115.

It is to be understood, however, that even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A mounting apparatus for mounting a memory card having a cutout defined in one side of the memory card, the mounting apparatus comprising:
   a socket; and
   a latching member comprising a main body, two pivoting portions respectively extending from opposite ends of the main body for pivotably mounting the latching member to one end of the socket, and a substantially C-shaped hooking portion extending down from a middle portion of the main body;
   wherein when the memory card is plugged into the socket, a bottom of the memory card presses the hooking portion to rotate the latching member to make the main body engage in the cutout of the memory card.

2. The mounting apparatus of claim 1, wherein when to release the memory card, the main body is pivoted outward until the main body is released from the cutout meanwhile the locking portion is rotated to push up the memory card.

3. The mounting apparatus of claim 1, wherein a connecting portion is formed on one end of the socket, the connecting portion comprises two parallel supporting plates, a pin protrudes on an outer surface of each of the supporting plates, a pivot hole is defined in each of the pivoting portions, the pins are pivotably engaged in the corresponding pivot holes respectively, to pivotably attach the latching member to the connecting portion.

4. The mounting apparatus of claim 3, wherein the hooking portion is located between the corresponding supporting plates.

5. The mounting apparatus of claim 3, wherein a positioning block protrudes on the outer surface of each of the supporting plates near the pin, for blocking the main body.

6. A mounting apparatus for mounting a memory card having two cutouts defined in opposite sides of the memory card, the mounting apparatus comprising:
   a socket comprising two connecting portions formed at opposite ends of the socket; and
   two latching members each comprising a main body, two pivoting portions respectively extending from opposite ends of the main body for pivotably mounting the corresponding latching member to one of the connecting portions, and a substantially C-shaped hooking portion extending down from a middle portion of the main body;

wherein when the memory card is plugged into the socket, a bottom of the memory card presses the hooking portions to rotate the latching members to make the main bodies engage in the cutouts of the memory card.

7. The mounting apparatus of claim 6, wherein when to release the memory card, the main bodies are pivoted outward until the main bodies are released from the cutouts respectively meanwhile the locking portions are rotated to push up the memory card.

8. The mounting apparatus of claim 6, wherein each of the connecting portions comprises two parallel supporting plates, a pin protrudes on an outer surface of each of the supporting plates, a pivot hole is defined in each of the pivoting portions, the pins are pivotably engaged in the corresponding pivot holes respectively, to pivotably attach the latching members to the corresponding connecting portions.

9. The mounting apparatus of claim 8, wherein the hooking portion is located between the corresponding supporting plates.

10. The mounting apparatus of claim 8, wherein a positioning block protrudes on the outer surface of each of the supporting plates near the pin, for blocking the corresponding main body.

11. An assembly comprising:
a motherboard having a socket with two connecting portions formed at opposite ends of the socket;
a memory card having two cutouts defined in opposite sides of the memory card;
two latching members each comprising a main body, two pivoting portions respectively extending from opposite ends of the main body for pivotably mounting the corresponding latching member to one of the connecting portions, and a substantially C-shaped hooking portion extending down from a middle portion of the main body;

wherein when the memory card is plugged into the socket, a bottom of the memory card presses the hooking portions to rotate the latching members to make the main bodies engage in the cutouts of the memory card.

12. The assembly of claim 11, wherein when to release the memory card, the main bodies are pivoted outward until the main bodies are released from the cutouts respectively meanwhile the locking portions are rotated to push up the memory card.

13. The assembly of claim 11, wherein each of the connecting portions comprises two parallel supporting plates perpendicular to the motherboard, a pin protrudes on an outer surface of each of the supporting plates, a pivot hole is defined in each of the pivoting portions, the pins are pivotably engaged in the corresponding pivot holes respectively, to pivotably attach the latching members to the corresponding connecting portions.

14. The assembly of claim 13, wherein the hooking portion is located between the corresponding supporting plates.

15. The assembly of claim 13, wherein a positioning block protrudes on the outer surface of each of the supporting plates near the pin, for blocking the corresponding main body.

* * * * *